United States Patent
Chen et al.

(10) Patent No.: US 11,259,632 B2
(45) Date of Patent: Mar. 1, 2022

(54) SLIDE RAIL ASSEMBLY AND RETURNING DEVICE THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shih-Lung Huang, Kaohsiung (TW); Yi-Syuan Jhao, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/809,773

(22) Filed: Mar. 5, 2020

(65) Prior Publication Data

US 2021/0153650 A1     May 27, 2021

(30) Foreign Application Priority Data

Nov. 22, 2019   (TW) .................................. 108142840

(51) Int. Cl.
*A47B 88/467*   (2017.01)
*A47B 88/473*   (2017.01)
*A47B 88/483*   (2017.01)

(52) U.S. Cl.
CPC .......... *A47B 88/467* (2017.01); *A47B 88/473* (2017.01); *A47B 88/483* (2017.01)

(58) Field of Classification Search
CPC ..... A47B 88/487; A47B 88/437; A47B 88/43; A47B 2210/004; A47B 2210/0056; A47B 88/493; A47B 88/467; A47B 88/49; A47B 88/50; A47B 88/477; A47B 88/427; A47B 88/40; F16C 2314/72; F16C 29/045; F16C 29/048; F16C 29/008
See application file for complete search history.

(56) References Cited

U.S. PATENT DOCUMENTS

| | | | |
|---|---|---|---|
| 5,207,781 A | 5/1993 | Rock | |
| 5,474,375 A * | 12/1995 | Hollenstein | A47B 88/467 312/319.1 |
| 6,733,097 B2 | 5/2004 | Kim et al. | |
| 7,465,000 B2 * | 12/2008 | Huang | A47B 88/467 312/333 |

(Continued)

FOREIGN PATENT DOCUMENTS

EP       0631745 A1      1/1995

*Primary Examiner* — Hanh V Tran
(74) *Attorney, Agent, or Firm* — Karin L. Williams; Alan D. Kamrath; Mayer & Williams PC

(57) ABSTRACT

A slide rail assembly includes a first rail, a second rail, a returning device and a connecting device. The returning device is arranged on the first rail and includes an elastic member and a movable member. The connecting device is arranged on the second rail and includes a first connecting member and a second connecting member. During a process of the second rail being moved relative to the first rail from an extended position along a retracting direction, the second connecting member is configured to contact the movable member, in order to drive the movable member to switch from a second state to a first state. Accordingly, the second rail is configured to be driven to move to a retracted position by an elastic force of the elastic member.

15 Claims, 7 Drawing Sheets

(56) References Cited

U.S. PATENT DOCUMENTS

| | | | |
|---|---|---|---|
| 7,878,606 B2 | 2/2011 | Chen et al. | |
| 7,967,402 B2 * | 6/2011 | Hoshide | A47B 88/467 312/333 |
| 8,632,142 B2 * | 1/2014 | Park | A47B 88/467 312/333 |
| 9,642,460 B2 | 5/2017 | Chen et al. | |
| 10,221,604 B2 * | 3/2019 | Zimmer | E05F 1/16 |
| 10,758,043 B2 * | 9/2020 | Pohlmann | A47B 88/467 |
| 2004/0227438 A1 * | 11/2004 | Tseng | A47B 88/467 312/333 |
| 2004/0237252 A1 * | 12/2004 | Hoshide | E05F 1/16 16/72 |
| 2006/0113169 A1 * | 6/2006 | Leon | A47B 88/467 200/5 R |
| 2007/0132346 A1 * | 6/2007 | Huang | A47B 88/467 312/333 |
| 2011/0037362 A1 * | 2/2011 | Park | A47B 88/467 312/319.1 |
| 2013/0026899 A1 * | 1/2013 | Babucke-Runte | F24C 15/168 312/334.1 |
| 2013/0182978 A1 * | 7/2013 | Huang | A47B 88/467 384/21 |
| 2014/0021840 A1 * | 1/2014 | Radusin | A47B 88/467 312/319.1 |
| 2014/0189979 A1 * | 7/2014 | Rioja Calvo | A47B 88/467 16/80 |
| 2014/0300262 A1 * | 10/2014 | Flogaus | A47B 88/47 312/319.1 |
| 2015/0366345 A1 * | 12/2015 | Chen | A47B 88/467 312/319.1 |
| 2016/0076288 A1 * | 3/2016 | Bantie | E05F 1/16 49/417 |
| 2016/0150880 A1 * | 6/2016 | Chen | A47B 88/467 312/319.1 |
| 2018/0203395 A1 * | 7/2018 | Kang | G03G 15/6508 |
| 2019/0090634 A1 * | 3/2019 | Chen | A47B 88/483 |

* cited by examiner

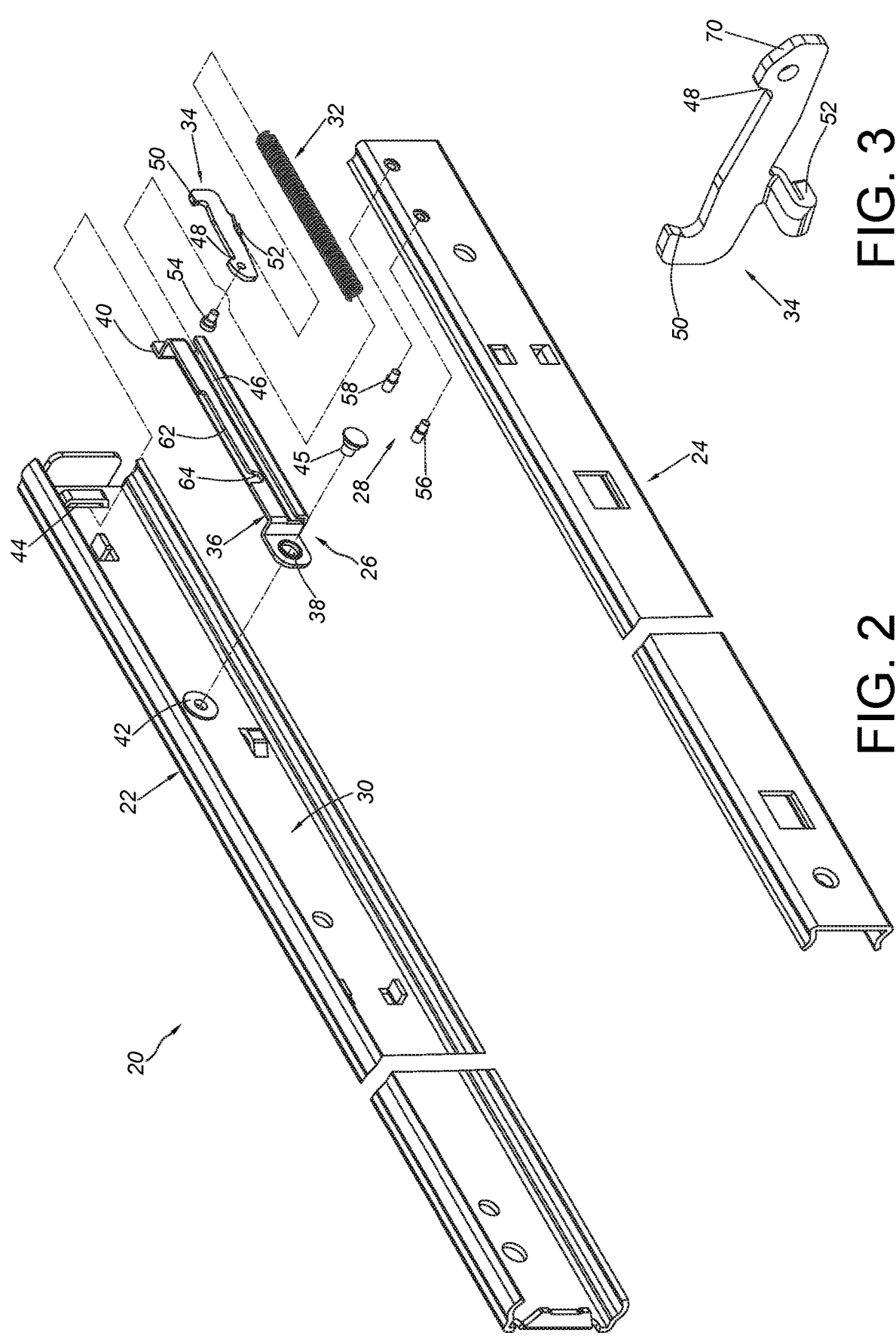

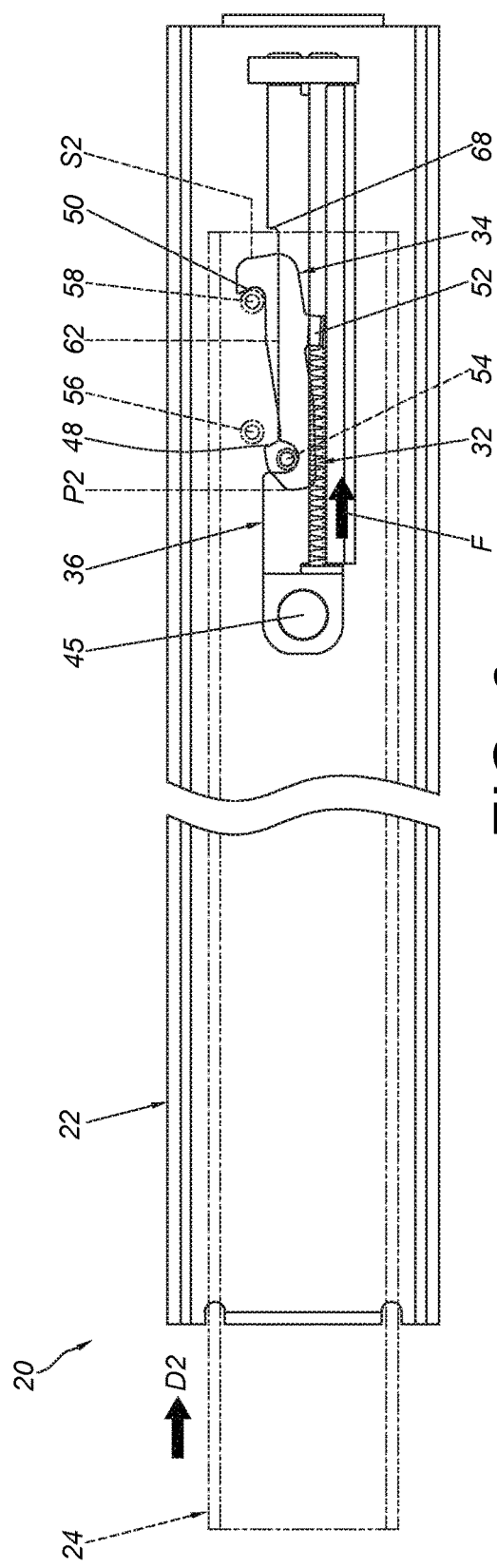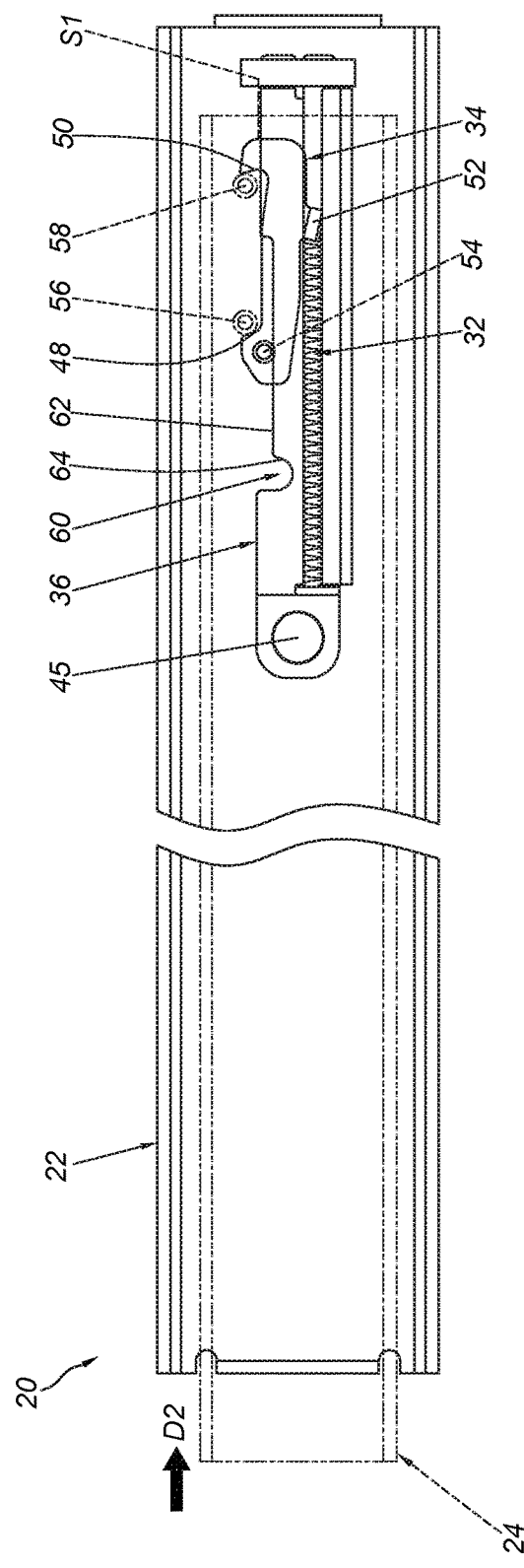

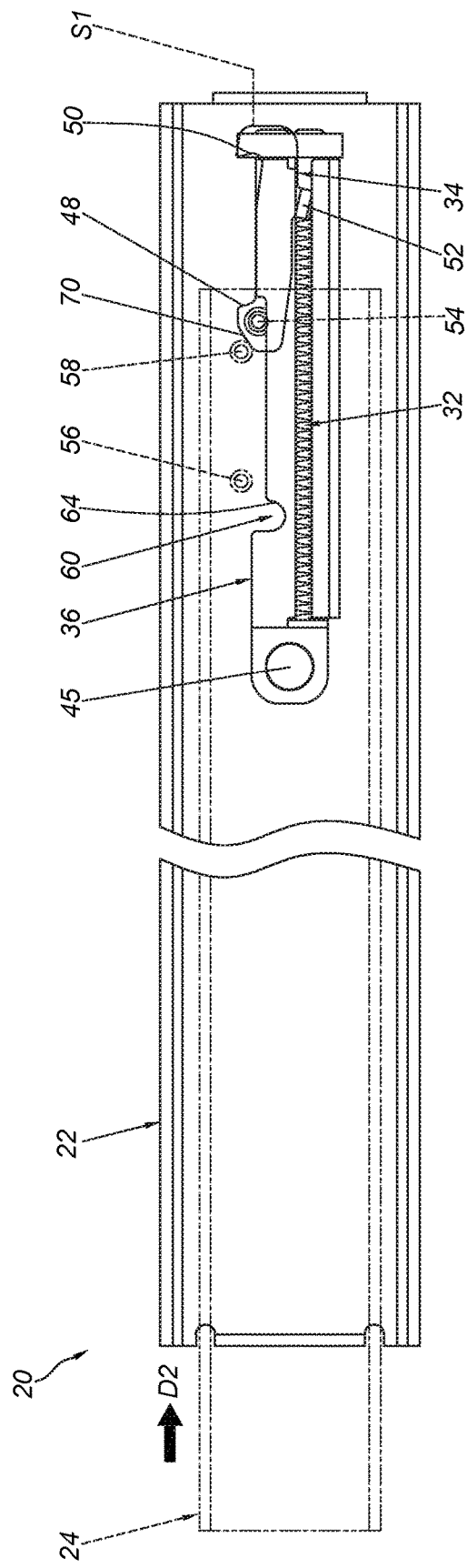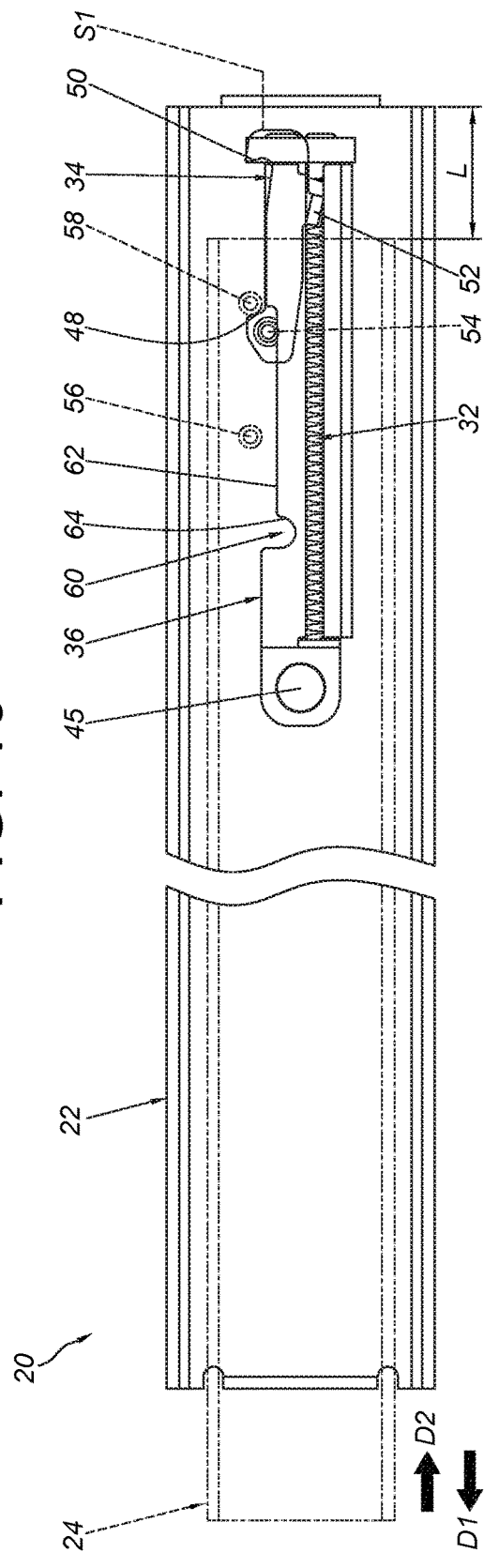

SLIDE RAIL ASSEMBLY AND RETURNING DEVICE THEREOF

BACKGROUND OF THE INVENTION

1. Field of the Invention

The present invention relates to a slide rail assembly, and more particularly, to a slide rail assembly with a self-closing function and a returning device thereof.

2. Description of the Prior Art

U.S. Pat. No. 5,207,781A discloses a closing device applicable to a fixed member (a cabinet or a fixed rail) and a movable member (a drawer or a movable rail). The closing device has a path arranged on the fixed member, a tiltable member movable along the path and a spring connected to the tiltable member. On the other hand, the movable member is arranged with a pin member. As shown in FIG. 1 to FIG. 4 of the aforementioned patent, during a process of the movable member being moved from a retracted position along an extending direction to an extended position, the movable member is configured to drive the tiltable member to move from a rectilinear portion of the path to an arcuate portion through the pin member. In such state, the spring is stretched and extended along the extending direction to accumulate an elastic force. When the movable member is moved from the extended position along a retracting direction, the movable member is configured to drive the tiltable member to move from the arcuate portion back to the rectilinear portion through the pin member, such that the spring releases the elastic force to drive the movable member back to the retracted position.

However, for different market requirements, the closing device provided in the aforementioned patent may not meet specific needs due to limitations of usage environment of the fixed member and the movable member. Therefore, it is important to develop various products.

SUMMARY OF THE INVENTION

The present invention relates to a slide rail assembly with a self-closing function and a returning device thereof.

According to an embodiment of the present invention, a slide rail assembly comprises a first rail, a second rail, a returning device and a connecting device. The second rail is movable relative to the first rail. The returning device is arranged on the first rail, and the returning device comprises an elastic member and a movable member. The movable member is arranged with a first blocking part and a second blocking part. The connecting device is arranged on the second rail, and the connecting device comprises a first connecting member and a second connecting member. During a process of the second rail being moved relative to the first rail from a retracted position along an extending direction, the first connecting member is configured to contact the first blocking part of the movable member, in order to drive the movable member to move from a first predetermined position to a second predetermined position and to switch from a first state to a second state. When the movable member is in the second state, the first connecting member no longer contacts the first blocking part of the movable member, the elastic member is configured to generate an elastic force in response to the movable member being located at the second predetermined position, and the second rail is movable relative to the first rail to an extended position along the extending direction. During a process of the second rail being moved relative to the first rail from the extended position along a retracting direction, the second connecting member is configured to contact the second blocking part of the movable member in order to drive the movable member to return to the first state from the second state, and the second rail is configured to be driven to move to the retracted position by the elastic force of the elastic member.

Preferably, the second rail is movably mounted to the first rail.

Preferably, the returning device further comprises a housing connected to the first rail, and the housing has an accommodating room configured to accommodate the elastic member.

Preferably, the movable member comprises a supporting part, and the elastic member is configured to elastically abut against the supporting part.

Preferably, the slide rail assembly further comprises a positioning part arranged on one of the housing and the first rail, and the movable member is arranged with an engaging feature. When the movable member is located at the second predetermined position, the movable member is configured to engage with the positioning part through the engaging feature.

Preferably, the housing has a rear blocking feature away from the positioning part. The rear blocking feature is configured to prevent the movable member at the first predetermined position from being moved along the retracting direction.

Preferably, a guiding feature is arranged on the movable member and adjacent to the first blocking part of the movable member. During a process of the second rail being moved from the extended position along the retracting direction with the movable member being in the first state, the second connecting member is configured to be guided by the guiding feature to contact the first blocking part of the movable member, such that when the second rail is further moved along the extending direction, the second connecting member is configured to drive the movable member to move along the extending direction to the second predetermined position.

Preferably, the returning device is made of a metal material.

Preferably, the connecting device is made of a metal material.

Preferably, both of the returning device and the connecting device are made of stainless steel.

According to another embodiment of the present invention, a slide rail assembly comprises a first rail, a second rail, a returning device and a connecting device. The second rail is movable relative to the first rail. The returning device is arranged on the first rail, and the returning device comprises an elastic member and a movable member. The movable member is arranged with a first blocking part and a second blocking part. The connecting device is arranged on the second rail, and the connecting device comprises a first connecting member and a second connecting member. A guiding feature is arranged on the movable member and adjacent to the first blocking part of the movable member. During a process of the second rail being moved from an extended position along a retracting direction with the movable member being in a first state, the second connecting member is configured to be guided by the guiding feature to contact the first blocking part of the movable member, such that when the second rail is further moved along an extending direction, the second connecting member is configured to drive the movable member to move along the extending direction until the movable member is in a second state.

According to another embodiment of the present invention, a returning device comprises an elastic member, a housing and a movable member. The housing has an accommodating room configured to accommodate the elastic member, and the housing is arranged with a positioning part. The movable member is movable relative to the housing to be in one of a first state and a second state. The movable member comprises a first blocking part, a second blocking part and an engaging feature. The elastic member is configured to elastically support the movable member. When the movable member is in the first state, the first blocking part and the second blocking part are substantially located at a same horizontal position. When the movable member is moved relative to the housing along an extending direction to a predetermined position, the elastic member is pressed to generate an elastic force, and the engaging feature of the movable member is configured to engage with the positioning part of the housing to be in the second state. When the movable member is in the second state, the first blocking part and the second blocking part are located at different horizontal positions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded view of the slide rail assembly comprising a first rail, a second rail and a returning device according to an embodiment of the present invention;

FIG. 3 is a diagram showing a movable member of the returning device according to an embodiment of the present invention;

FIG. 8 is a diagram showing the second rail of the slide rail assembly being moved relative to the first rail along an retracting direction according to an embodiment of the present invention;

FIG. 9 is a diagram showing the second rail of the slide rail assembly being further moved relative to the first rail along the retracting direction according to an embodiment of the present invention;

FIG. 10 is a diagram showing the returning device of the slide rail assembly being in a failure state with the second rail being moved relative to the first rail along the retracting direction according to an embodiment of the present invention; and FIG. 11 is a diagram showing the returning device of the slide rail assembly being in the failure state with the second rail being further moved relative to the first rail along the retracting direction, so as to allow a second connecting member of the second rail to contact a first blocking part of a movable member according to an embodiment of the present invention.

DETAILED DESCRIPTION

Figure 1:
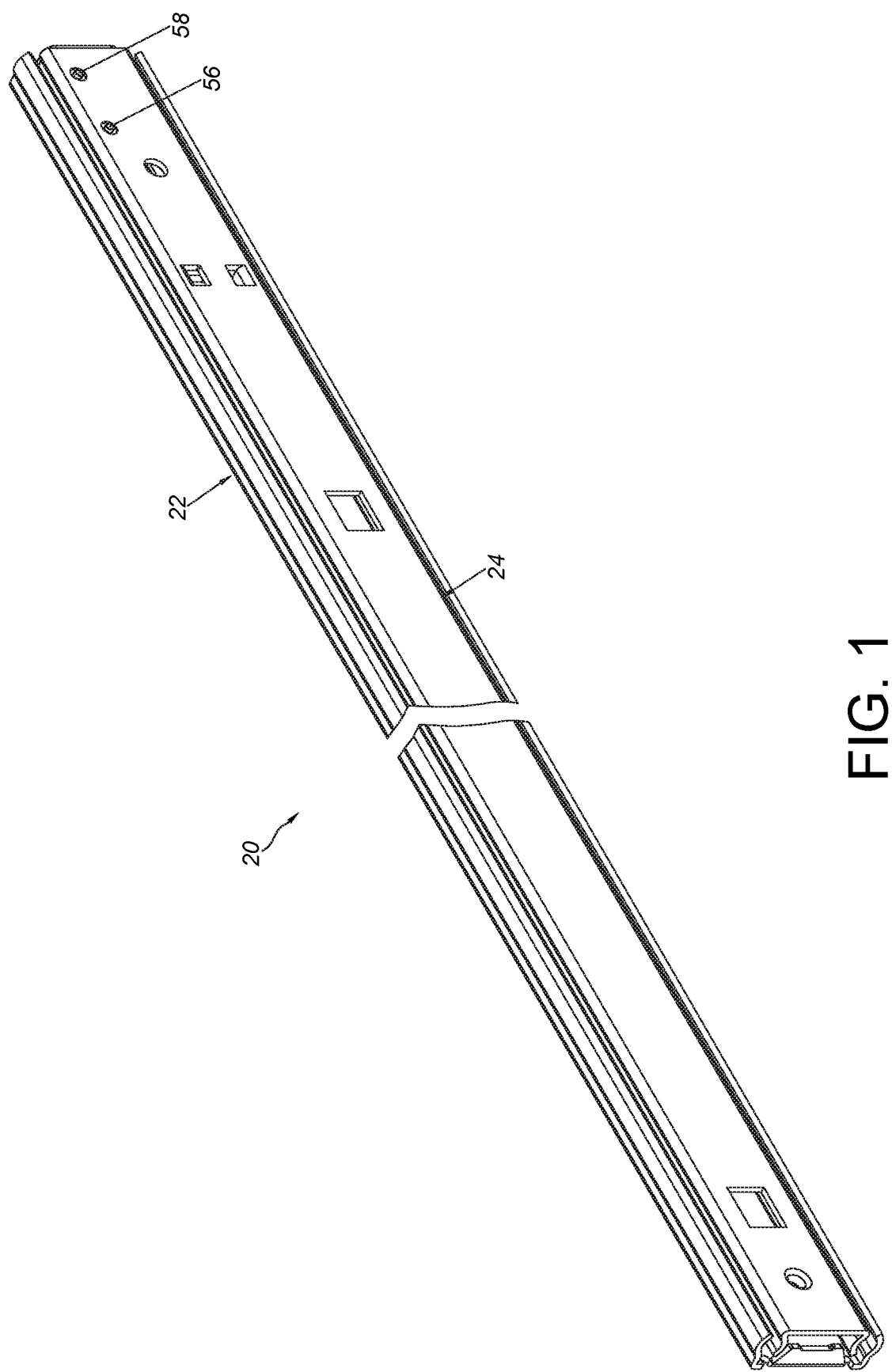
FIG. 1 is a diagram showing a slide rail assembly according to an embodiment of the present invention.

As shown in FIG. 1 and FIG. 2, a slide rail assembly 20 comprises a first rail 22, a second rail 24, a returning device 26 and a connecting device 28 according to an embodiment of the present invention.

The first rail 22 comprises a plurality of walls defining a longitudinal passage 30. The second rail 24 is movably mounted to the longitudinal passage 30 of the first rail 22 to be longitudinally movable relative to the first rail 22. The connecting device 28 is arranged on the second rail 24, and the connecting device 28 comprises a first connecting member 56 and a second connecting member 58.

Figure 4:
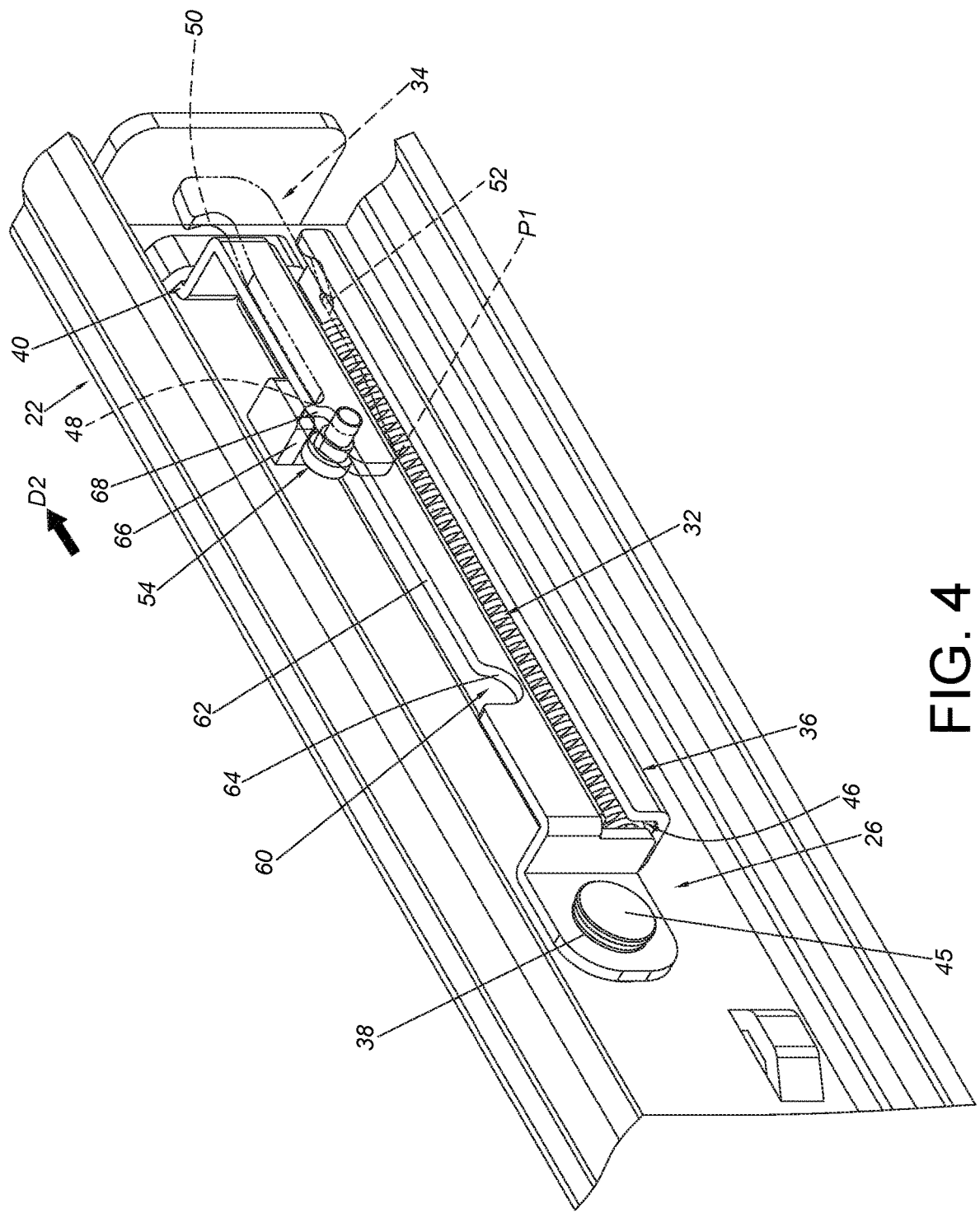
FIG. 4 is a diagram showing the returning device being arranged on the first rail of the slide rail assembly according to an embodiment of the present invention.

As shown in FIG. 2, FIG. 3 and FIG. 4, the returning device 26 is arranged on the first rail 22, and the returning device 26 comprises an elastic member 32 and a movable member 34. Preferably, the returning device 26 further comprises a housing 36.

The housing 36 is connected to the first rail 22. For example, the housing 36 can be fixed to the first rail 22 by riveting, engaging or screwing. In the present embodiment, the housing 36 has a first connecting feature 38 and a second connecting feature 40 respectively fixed to a first corresponding feature 42 and a second corresponding feature 44 of the first rail 22. The first connecting feature 38 is fixed to the first corresponding feature 42 through a fixing member 45. The housing 36 has an accommodating room 46 configured to accommodate the elastic member 32. Preferably, the accommodating room 46 can be a longitudinal groove. The movable member 34 is movably mounted to the housing 36, and the movable member 34 is arranged with a first blocking part 48 and a second blocking part 50. Preferably, the movable member 34 further comprises a supporting part 52 and an engaging feature 54. Preferably, the first blocking part 48 and the second blocking part 50 are respectively located at a front portion and a rear portion of the movable member 34, and a space is defined between the first blocking part 48 and the second blocking part 50. The supporting part 52 is elastically supported by the elastic member 32. The engaging feature 54 is arranged adjacent to the first blocking part 48.

Preferably, one of the housing 36 and the first rail 22 is arranged with a positioning part 60. In the present embodiment, the positioning part 60 is arranged on the housing 36, but the present invention is not limited thereto.

Preferably, the housing 36 is formed with a longitudinal path 62 and a bending path 64. The bending path 64 is configured to extend from the longitudinal path 62, and the bending path 64 is bent relative to the longitudinal path 62. A wall surface of the bending path 64 has a substantially curved profile, and the positioning part 60 is defined by the wall surface of the bending path 64. The movable member 34 is movable relative to the housing 36 along the longitudinal path 62 and the bending path 64.

Preferably, at least one of the first rail 22 and the housing 36 has a rear blocking feature. In the present embodiment, the first rail 22 has a first rear blocking feature 66, and the housing 36 has a second rear blocking feature 68. Both the first rear blocking feature 66 and the second rear blocking feature 68 are spaced from the positioning part 60 and located at positions corresponding to the engaging feature 54 of the movable member 34. The first rear blocking feature 66 and the second rear blocking feature 68 are configured to prevent the movable member 34 at a first predetermined position P1 from moving along a retracting direction D2. The second rear blocking feature 68 can be slightly located behind the first rear blocking feature 66 for facilitating adjustment of the second rail 24 when being mounted to a movable object (such as a drawer). However, in other embodiment of the present invention, only the housing 36 has the rear blocking feature, and the first rail 22 does not have the rear blocking feature.

Figure 5:
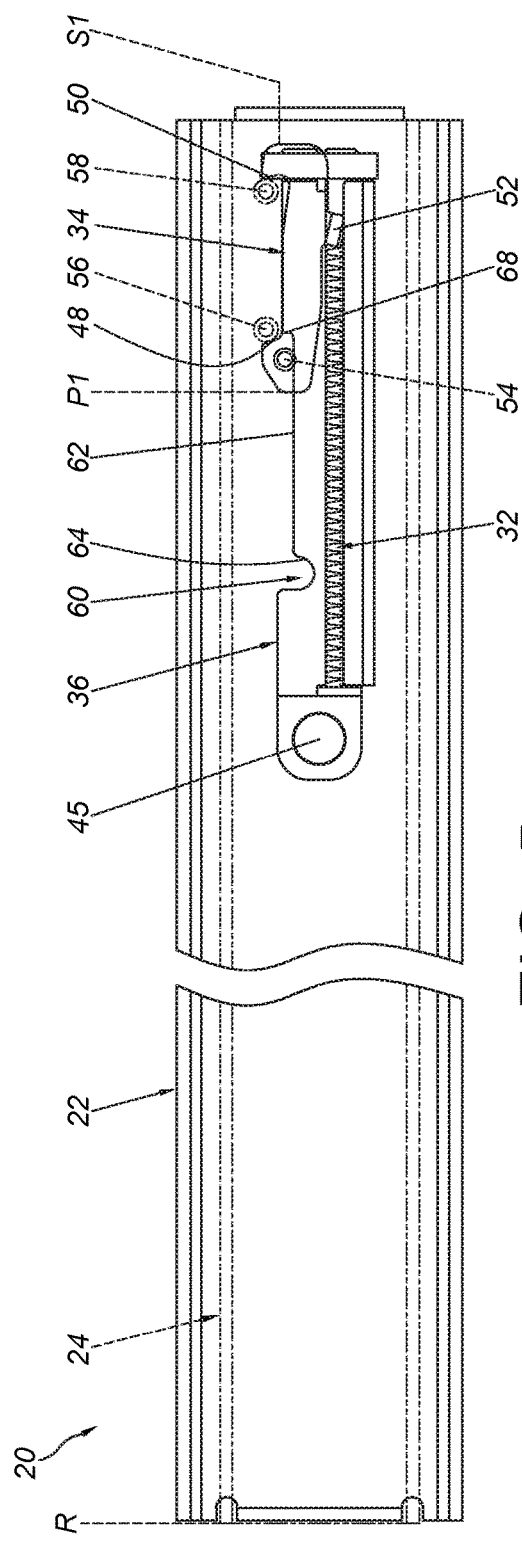
FIG. 5 is a diagram showing the slide rail assembly being in a retracted state according to an embodiment of the present invention.

As shown in FIG. 5, the slide rail assembly 20 is in a retracted state. The second rail 24 is located at a retracted position R relative to the first rail 22. The movable member 34 contacts the elastic member 32 through the supporting part 52. The movable member 34 is located at the first predetermined position P1 relative to the housing 36. The first connecting member 56 and the second connecting member 58 of the second rail 24 are located in the space between the first blocking part 48 and the second blocking part 50 of the movable member 34.

Preferably, the movable member 34 is movable along the longitudinal path 62 through the engaging feature 54, and the movable member 34 is configured to be supported by the longitudinal path 62 through the engaging feature 54 to be held in a first state S1.

Preferably, when the movable member 34 is in the first state S1, the first blocking part 48 and the second blocking part 50 are substantially located at a same horizontal position.

Figure 6:
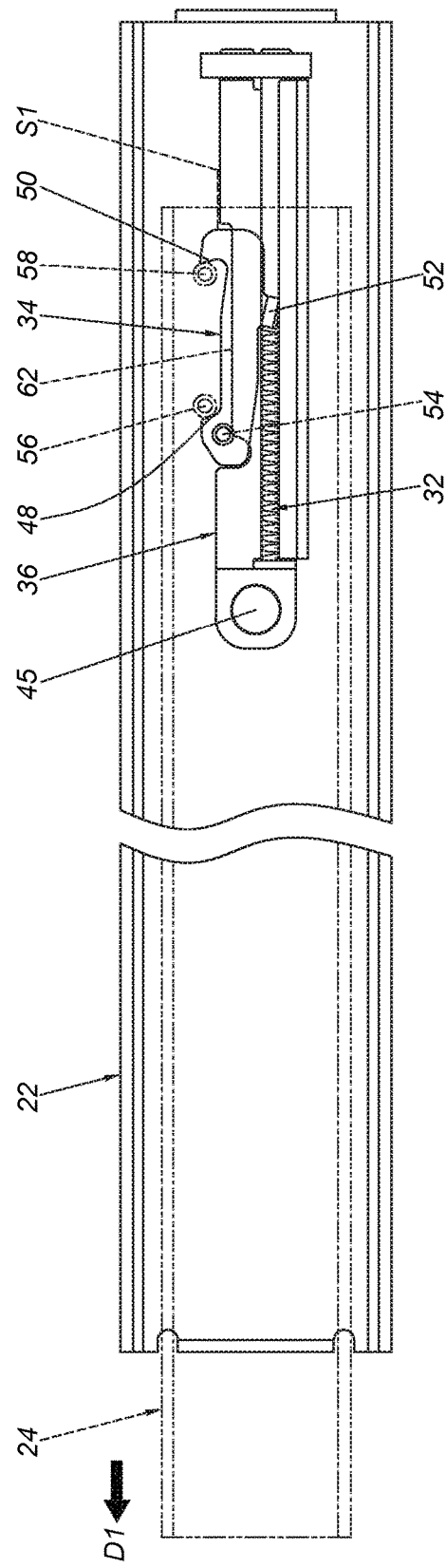
FIG. 6 is a diagram showing the second rail of the slide rail assembly being moved relative to the first rail along an extending direction according to an embodiment of the present invention.

As shown in FIG. 5 and FIG. 6, during a process of the second rail 24 being moved relative to the first rail 22 from the retracted position R along an extending direction D1, the first connecting member 56 contacts the first blocking part 48 of the movable member 34, so as to drive the movable member 34 to move from the first predetermined position P1 along the extending direction D1.

Figure 7:
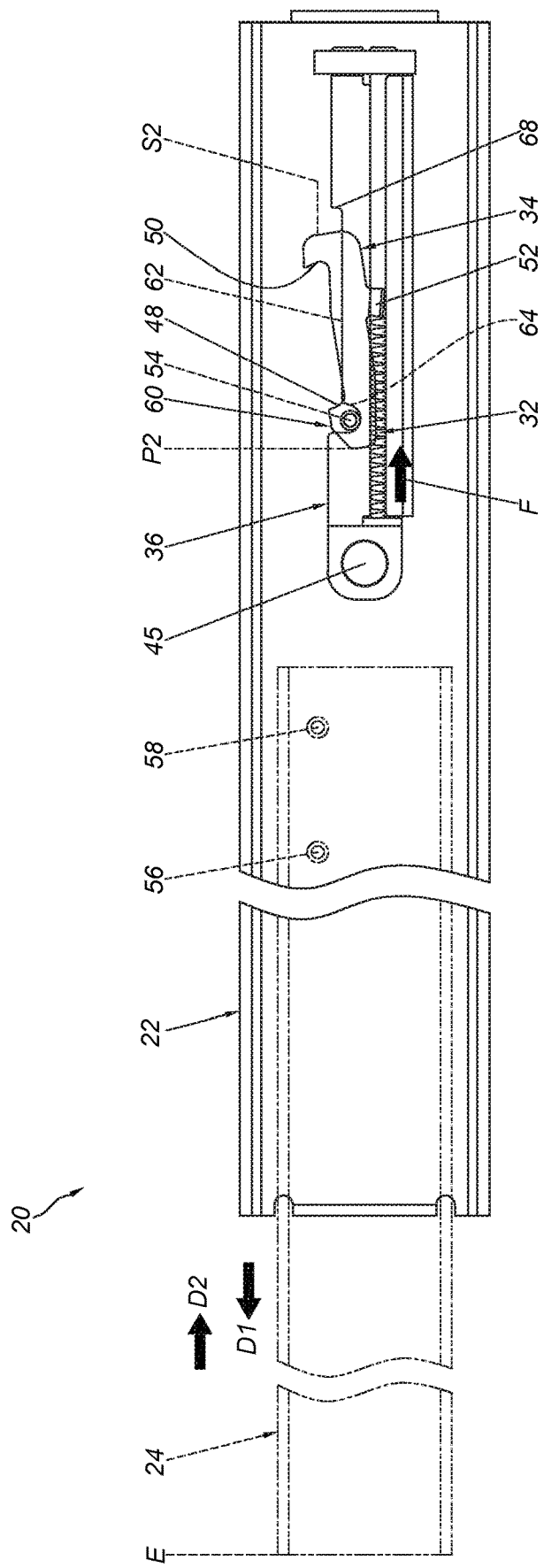
FIG. 7 is a diagram showing the second rail of the slide rail assembly being further moved relative to the first rail along the extending direction to an extended position according to an embodiment of the present invention.

As shown in FIG. 7, during the process of the second rail 24 being further moved relative to the first rail 22 along the extending direction D1, the movable member 34 is driven to move relative to the housing 36 along the extending direction D1 to a second predetermined position P2, and the movable member 34 is rotated to switch from the first state S1 to a second state S2. When the movable member 34 is in the second state S2, the first connecting member 56 no longer contacts the first blocking part 48 of the movable member 34, and the elastic member 32 generates an elastic force F in response to the moveable member 34 being located at the second predetermined position P2 (for example, the elastic member 32 accumulates the elastic force F toward the retracting direction D2). The second rail 24 can be further moved relative to the first rail 22 along the extending direction D1 to an extended position E, such that the slide rail assembly 20 is in an extended state. Preferably, when the movable member 34 is located at the second predetermined position P2, the engaging feature 54 of the movable member 34 is engaged with the positioning part 60 on the bending path 64 of the housing 36.

Preferably, when the movable member 34 is in the second state S2, the first blocking part 48 and the second blocking part 50 are located at different horizontal positions. In other words, the first blocking part 48 and the second blocking part 50 are located at different heights.

As shown in FIG. 7, FIG. 8 and FIG. 9, during an end process of the second rail 24 being moved relative to the first rail 22 from the extended position E along the retracting direction D2, the second connecting member 58 is configured to contact the second blocking part 50 of the movable member 34 to drive the movable member 34 to return to the first state S1 (as shown in FIG. 9) from the second state S2 (as shown in FIG. 8), such that the first blocking part 48 of the movable member 34 contacts the first connecting member 56. Moreover, the movable member 34 is configured to drive the second rail 24 to move along the retracting direction D2 to the retracted position R (please also refer to FIG. 5) by using the elastic force of the elastic member 32 (such as the elastic force F of the elastic member 32 toward the retracting direction D2).

Moreover, the configuration of the movable member 34 driving the second rail 24 to move along the retracting direction D2 to the retracted position R in response to the elastic force F of the elastic member 32 of the returning device 26 is a so-called slide rail self-closing function.

As shown in FIG. 10 and FIG. 11, the slide rail self-closing function may fail. For example, when the second rail 24 is located at the extended position E relative to the first rail 22, the elastic force F of the elastic member 32 may be accidentally released due to factors of external force, such that the movable member 34 is driven to move from the second predetermined position P2 along the retracting direction D2 to one position (the position can be substantially identical to the first predetermined position P1, but the present invention is not limited thereto) to be in the first state S. In such state, the slide rail assembly 20 cannot provide the slide rail self-closing function during the end process of the second rail 24 being moved relative to the first rail 22 from the extended position E along the retracting direction D2.

Moreover, in the present embodiment, a guiding feature 70 is arranged on the movable member 34 and adjacent to the first blocking part 48 of the movable member 34. The guiding feature 70 has an inclined surface or an arc surface, but the present invention is not limited thereto. Preferably, the guiding feature 70 and the first blocking part 48 are respectively located at two opposite sides of the front portion of the movable member 34.

During a process of the second rail 24 being moved from the extended position E along the retracting direction D2 with the movable member 34 being in the first state S1 (under failure of the slide rail self-closing function), the second connecting member 58 is configured to be guided by the guiding feature 70 (as shown in FIG. 10) to cross the front portion of the movable member 34 to contact the first blocking part 48 of the movable member 34 (as shown in FIG. 11). As such, when the second rail 24 is further moved along the extending direction D1, the second connecting member 58 is configured to contact the first blocking part 48 of the movable member 34 to drive the movable member 34 to move along the extending direction D1 to the second predetermined position P2 (please also refer to FIG. 7) to be in the second state S2 again. Accordingly, the elastic member 32 is configured to generate the elastic force F in response to the movable member 34 being located at the second predetermined position P2. Therefore, the slide rail self-closing function is restored again. According to such arrangement, the slide rail self-closing function can be restored without requiring the second rail 24 to be completely retracted into the first rail 22. In other words, a predetermined gap L can be kept between the second rail 24 and the first rail 22 before the second rail 24 being pulled out again for restoring the slide rail self-closing function, so as to prevent finger pinch near front ends of the rails.

Preferably, the returning device 26 and/or the connecting device 28 are made of a metal material, such as stainless steel. Therefore, the slide rail assembly 20 can be resistive to high temperature to be used in a specific environment (such as a high temperature environment).

Therefore, the slide rail assembly 20 according to the embodiments of the present invention is characterized in that:

1. The second rail 24 is arranged with the first connecting member 56 and the second connecting member 58. By using the elastic force F of the elastic member 32 of the returning device 26 when the first blocking part 48 of the movable member 34 contacts the first connecting member 56, the movable member 34 can drive the second rail 24 to move along the retracting direction D2 to the retracted position R, in order to provide the so-called slide rail self-closing function. In addition, under failure of the slide rail self-closing function, the second connecting member 58 is able to contact the first blocking part 48 of the movable member 34 to drive the movable member 34 to move along the extending direction D1 to the second predetermined position P2 to be in the second state S2, such that the elastic member 32 can generate the elastic force F in response to the movable member 34 being located at the second predetermined position P2, in order to restore the slide rail self-closing function.

2. When the movable member 34 is in the first state S, the first blocking part 48 and the second blocking part 50 are located at substantially the same horizontal position. When the movable member 34 is in the second state S2, the first blocking part 48 and the second blocking part 50 are located at different horizontal positions.

3. The elastic member 32 is pressed in response to movement of the movable member 34 along the extending direction D1. When the movable member 34 is located at the second predetermined position P2 relative to the housing 36, the elastic member 32 is configured to generate the elastic force F. In contrast to the prior art accumulating an elastic force by stretching a spring along the extending direction (the spring may be easily broken after being stretched frequently), the elastic member 32 of the present invention is configured to be pressed to accumulate the elastic force F, such that the returning device 26 can have a longer service life.

4. The returning device 26 and/or the connecting device 28 are made of a metal material. Therefore, the slide rail assembly 20 can be resistive to high temperature to be used in a specific environment.

5. When the slide rail self-closing function of the returning device 26 fails, the second connecting member 58 can be guided by the guiding feature 70 (as shown in FIG. 10) to contact the first blocking part 48 of the movable member 34 (as shown in FIG. 11), such that when the second rail 24 is moved along the extending direction D1, the second connecting member 58 is configured to contact the first blocking part 48 of the movable member 34 to drive the movable member 34 to move along the extending direction D1 to the second predetermined position P2 to be in the second state S2 again (please refer to FIG. 7). Accordingly, the elastic member 32 is configured to generate the elastic force F in response to the movable member 34 being in the second predetermined position P2. Therefore, the slide rail self-closing function is restored again.

6. The operation for restoring the slide rail self-closing function of the present invention can prevent finger pinch near the front ends of the rails.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly resistive to high temperature, comprising:
   a first rail having a first rear blocking feature;
   a second rail movable relative to the first rail;
   a returning device arranged on the first rail, the returning device comprising a housing, an elastic member and a movable member, wherein the movable member is arranged with a first blocking part and a second blocking part, and the housing has a second rear blocking feature located slightly behind the first rear blocking feature; and
   a connecting device arranged on the second rail, the connecting device comprising a first connecting member and a second connecting member, wherein the first connecting member and the second connecting member are cylindrical;
   wherein the returning device and the connecting device are made of a metal material;
   wherein during a process of the second rail being moved relative to the first rail from a retracted position along an extending direction, the first connecting member is configured to contact the first blocking part of the movable member, in order to drive the movable member to move from a first predetermined position to a second predetermined position along the extending direction and to switch from a first state to a second state;
   wherein the elastic member is configured to be pressed to generate an elastic force in response to movement of the movable member along the extending direction;
   wherein when the movable member is in the second state, the first connecting member no longer contacts the first blocking part of the movable member, the elastic member is configured to accumulate the elastic force in response to the movable member being located at the second predetermined position, and the second rail is movable relative to the first rail to an extended position along the extending direction;
   wherein during a process of the second rail being moved relative to the first rail from the extended position along a retracting direction, the second connecting member is configured to contact the second blocking part of the movable member in order to drive the movable member to return to the first state from the second state, and the second rail is configured to be driven to move to the retracted position by the elastic force of the elastic member;
   wherein the first rear blocking feature and the second rear blocking feature are configured to prevent the movable member at the first predetermined position from moving along the retracting direction.

2. The slide rail assembly of claim 1, wherein the second rail is movably mounted to the first rail.

3. The slide rail assembly of claim 1, wherein the housing is connected to the first rail, and the housing has an accommodating room configured to accommodate the elastic member.

4. The slide rail assembly of claim 3, wherein the movable member comprises a supporting part, and the elastic member is configured to elastically abut against the supporting part.

5. The slide rail assembly of claim 3, further comprising a positioning part arranged on one of the housing and the first rail; wherein the movable member is arranged with an engaging feature; wherein when the movable member is located at the second predetermined position, the movable member is configured to engage with the positioning part through the engaging feature.

6. The slide rail assembly of claim 5, wherein the first and second rear blocking feature are spaced from the positioning part.

7. The slide rail assembly of claim 1, wherein a guiding feature is arranged on the movable member and adjacent to the first blocking part of the movable member; wherein during a process of the second rail being moved from the extended position along the retracting direction with the movable member being in the first state, the second connecting member is configured to be guided by the guiding feature to contact the first blocking part of the movable member, such that when the second rail is further moved along the extending direction, the second connecting member is configured to drive the movable member to move along the extending direction to the second predetermined position.

8. The slide rail assembly of claim 1, wherein both of the returning device and the connecting device are made of stainless steel.

9. A slide rail assembly resistive to high temperature, comprising:
a first rail having a first rear blocking feature;
a second rail movable relative to the first rail;
a returning device arranged on the first rail, the returning device comprising a housing, an elastic member and a movable member, wherein the movable member is arranged with a first blocking part and a second blocking part, and the housing has a second rear blocking located slightly behind the first rear blocking feature; and
a connecting device arranged on the second rail, the connecting device comprising a first connecting member and a second connecting member, wherein the first connecting member and the second connecting member are cylindrical;
wherein the returning device and the connecting device are made of a metal material;
wherein a guiding feature is arranged on the movable member and adjacent to the first blocking part of the movable member;
wherein during a process of the second rail being moved relative to the first rail from a retracted position along an extending direction, the first connecting member is configured to contact the first blocking part of the movable member, in order to drive the movable member to move from a first predetermined position to a second predetermined position along the extending direction and to switch from a first state to a second state;
wherein during a process of the second rail being moved from an extended position along a retracting direction with the movable member being in the first state, the second connecting member is configured to be guided by the guiding feature to contact the first blocking part of the movable member, such that when the second rail is further moved along an extending direction, the second connecting member is configured to drive the movable member to move along the extending direction until the movable member is in the second state;
wherein the elastic member is configured to be pressed to generate an elastic force in response to movement of the movable member along the extending direction;
wherein the first rear blocking feature and the second rear blocking feature are configured to prevent the movable member at the first predetermined position from moving along the retracting direction.

10. The slide rail assembly of claim 9, wherein when the movable member is located at the second predetermined position, the movable member is in the second state, and the elastic member is configured to generate the elastic force in response to the movable member being located at the second predetermined position.

11. The slide rail assembly of claim 10, wherein during a process of the second rail being moved relative to the first rail from the extended position along the retracting direction, the second connecting member is configured to contact the second blocking part of the movable member in order to drive the movable member to return to the first state from the second state, and the second rail is configured to be driven to move to the retracted position by the elastic force of the elastic member.

12. The slide rail assembly of claim 9, wherein the second rail is movably mounted to the first rail.

13. The slide rail assembly of claim 11, wherein the housing is connected to the first rail, and the housing has an accommodating room configured to accommodate the elastic member.

14. The slide rail assembly of claim 13, wherein the movable member comprises a supporting part, and the elastic member is configured to elastically abut against the supporting part.

15. The slide rail assembly of claim 13, further comprising a positioning part arranged on one of the housing and the first rail; wherein the movable member is arranged with an engaging feature; wherein when the movable member is located at the predetermined position, the movable member is configured to engage with the positioning part through the engaging feature.

* * * * *